United States Patent
Eleftheriou et al.

(10) Patent No.: US 8,996,794 B2
(45) Date of Patent: Mar. 31, 2015

(54) FLASH MEMORY CONTROLLER

(75) Inventors: Evangelos S. Eleftheriou, Rueschlikon (CH); Robert Haas, Rueschlikon (CH); Xiao-Yu Hu, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 13/515,118

(22) PCT Filed: Dec. 9, 2010

(86) PCT No.: PCT/IB2010/055684
§ 371 (c)(1),
(2), (4) Date: Jun. 11, 2012

(87) PCT Pub. No.: WO2011/070526
PCT Pub. Date: Jun. 16, 2011

(65) Prior Publication Data
US 2012/0278544 A1 Nov. 1, 2012

(30) Foreign Application Priority Data

Dec. 11, 2009 (EP) .................................... 09178949

(51) Int. Cl.
*G06F 12/02* (2006.01)
*G06F 13/16* (2006.01)
(Continued)

(52) U.S. Cl.
CPC .......... *G06F 13/1668* (2013.01); *G11C 7/1042* (2013.01); *G06F 9/3004* (2013.01)
USPC ...................... 711/103; 365/185.33

(58) Field of Classification Search
CPC .................... G06F 12/0246; G06F 2212/7208; G06F 13/1657; G06F 12/0607; G06F 11/1068; G06F 2212/7203; G06F 3/0679; G06F 13/1668; G06F 12/0238; G06F 12/06; G06F 2212/1016; G06F 2212/202; G06F 3/064; G06F 9/3004; G11C 7/1042; G11C 2211/5641; G11C 16/0483; G11C 11/5621; G11C 13/0004; G11C 2211/5648
USPC ...................... 711/103; 365/185.33
See application file for complete search history.

(56) References Cited

U.S. PATENT DOCUMENTS

2001/0011320 A1* 8/2001 Chevallier .................... 711/103
2004/0210729 A1* 10/2004 Horii et al. .................... 711/156
(Continued)

FOREIGN PATENT DOCUMENTS

| WO | WO2008/070173 A1 | 6/2008 |
| WO | WO2009/140112 A1 | 11/2009 |
| WO | WO 2009/086404 | 10/2012 |

OTHER PUBLICATIONS

Lee, Jongmin et al., "CPS-SIM: Configurable and Accurate Clock Precision Solid State Drive Simulator," ACM (2009), pp. 318-325.
(Continued)

*Primary Examiner* — Hashem Farrokh
(74) *Attorney, Agent, or Firm* — Scully, Scott, Murphy & Presser, P.C.; Jeff Tang, Esq.

(57) ABSTRACT

A Flash memory controller is coupled to a first Flash memory package through a first Flash memory interface and to a second Flash memory package through the first Flash memory interface. The Flash memory controller is designed to receive a first instruction relating to the first Flash memory package and to perform a first process depending on the first instruction. The Flash memory controller is further designed to receive a second instruction relating to the second Flash memory package and to perform a second process depending on the second instruction. The Flash memory controller is further adapted for splitting the first process into at least two first sub-steps and for splitting the second process into at least two second sub-steps. The Flash memory controller is further adapted for executing the first and second sub-steps, and for interleaving execution of first and second sub-steps.

15 Claims, 3 Drawing Sheets

(51) Int. Cl.
    *G11C 7/10*     (2006.01)
    *G06F 9/30*     (2006.01)

(56) References Cited

U.S. PATENT DOCUMENTS

| | | |
|---|---|---|
| 2008/0005471 A1 | 1/2008 | Ma et al. |
| 2008/0320214 A1* | 12/2008 | Ma et al. ............. 711/103 |
| 2009/0150751 A1 | 6/2009 | Jo et al. |
| 2009/0164703 A1* | 6/2009 | Racino et al. ............. 711/103 |
| 2010/0057979 A1* | 3/2010 | Chu et al. ............. 711/103 |
| 2010/0161886 A1* | 6/2010 | Toelkes et al. ............. 711/103 |

OTHER PUBLICATIONS

International Search Report dated Apr. 28, 2011 issued in PCT/IB2010/055684.

* cited by examiner

FLASH MEMORY CONTROLLER

CROSS-REFERENCE TO RELATED APPLICATIONS

The present invention relates to and claims the benefit of the filing date of commonly-owned, co-pending PCT Patent Application No. PCT/IB2010/055684, filed Dec. 9, 2010, which further claims the benefit of priority date of commonly-owned, co-pending European Patent Application No. EP 09178949.5, filed on Dec. 11, 2009, the entire contents and disclosure of which is incorporated by reference as if fully set forth herein.

TECHNICAL FIELD

The present invention relates to a Flash memory controller and to a method for operating a Flash memory controller.

BACKGROUND OF THE INVENTION

Solid-state based storage devices are becoming increasingly popular due to their low power consumption, ruggedness and high input-output (IO) performance compared to conventional hard disc drives. Most current solid-state storage devices are based on NAND-flash memory chips.

A typical configuration of a Flash-based storage system comprises at least one Flash memory controller and one or more Flash memory packages connected to the Flash memory controller through a serial, multiplexed Flash memory interface. Each Flash memory package is typically composed of one or more dies, each of which typically offers a capacity of 2 GB or more. Flash memory packages are accessed by sending multi-step commands over the multiplexed Flash memory interface. The Flash memory interface is commonly also referred to as a channel.

In an example configuration, each die within a package contains 8192 blocks. Each block in turn consists of 64 pages of 4 KB each. In addition to data, each page includes a 128 Byte region to store metadata or error detection and correction information.

Data reads and writes are typically done at page granularity. A typical read operation takes 25 µs to read a page from the cells into a 4 KB data buffer attached to each die. In addition to that, the data is transmitted from the data buffer to the Flash memory controller through the Flash memory interface. The Flash memory interface transfers data at typically 25 ns per Byte (according to ONFI-1 standard), or roughly 100 µs per page. During the transfer of the data from the Flash memory package to the Flash memory controller, the Flash memory interface is occupied and not available for competing data transfers.

A write operation takes the same time to transfer data from the Flash memory controller through the Flash memory interface to the data buffer inside the die. Afterwards it takes an additional 200 µs for the data to be written out to the individual memory cells of the die.

SUMMARY OF THE INVENTION

A Flash memory controller according to an embodiment of the present invention may be coupled to a first Flash memory package through a first Flash memory interface. A second Flash memory package may also be coupled to the Flash memory controller through the first Flash memory interface. The Flash memory controller is designed to receive a first instruction relating to the first Flash memory package and to perform a first process depending on the first instruction. The Flash memory controller is further designed to receive a second instruction relating to the second Flash memory package and to perform a second process depending on a second instruction. The Flash memory controller is further designed for splitting the first process into at least two first sub-steps and for splitting the second process into at least two second sub-steps. The Flash memory controller is further designed for executing the first and second sub-steps and for interleaving execution of first and second sub-steps. This Flash memory controller may improve IO throughput on the Flash memory interface and may eliminates a skew between the times required for executing read and write instruction.

The Flash memory controller may comprise a process list and be adapted for storing an unfinished process and a current sub-step of the unfinished process in the process list.

The Flash memory controller may further maintain a timer for an unfinished process, wherein the timer is adapted for triggering an event upon completion of a sub-step of the unfinished process. This may allow to efficiently pipeline sub-steps of multiple processes.

The Flash memory controller may further comprise an instruction queue and be adapted for pushing the first and/or the second instruction onto the instruction queue. This may allow for postponing instructions until processes relating to previous instructions have completed.

The first instruction may be a read instruction. The first process may then be a read process and be split into three sub-steps.

The first instruction may also be a write instruction. The first process then is a write process and is split into three sub-steps.

The first instruction may also be an erase instruction. The first process then is an erase process and is split into three sub-steps.

The first Flash memory package may comprise a first chip die. The first instruction may then relate to the first chip die of the first Flash memory package. The Flash memory controller may then be designed to receive a third instruction relating to the first chip die of the first Flash memory package and to perform a third process depending on the third instruction. The Flash memory controller is then designed for splitting the third process into at least two third sub-steps and for finishing execution of all first sub-steps before starting execution of a third sub-step. This may assure that two processes involving the same die are not executed in parallel. This may avoid an eventual corruption of data.

The Flash memory controller may be coupled to a third Flash memory package through a second Flash memory interface. The Flash memory controller can then simultaneously exchange data with a Flash memory package coupled to the first Flash memory interface and with a Flash memory package coupled to the second Flash memory interface.

The Flash memory controller may comprise a host interface and be adapted for receiving the first instruction and the second instruction through the host interface. This may allow for coupling the Flash memory controller to an external system, for example a personal computer.

The Flash memory controller may comprise a flag that marks the first Flash memory interface as busy or as free. This may allow for keeping track whether the first Flash memory interface is currently available or occupied.

In a further embodiment the Flash memory controller is connected to multiple Flash memory interfaces, each of which is connected to multiple Flash memory packages or chip dies. In this embodiment the Flash memory controller retrieves and stores data from the Flash memory packages or chip dies by issuing a stream of processes consisting of read, write and erase processes. Every read, write or erase process is split into multiple sub-steps. The Flash memory controller is designed such that sub-steps in a later process can proceed before sub-steps of an earlier process have completed. Furthermore, multiple processes can proceed in parallel inside multiple Flash memory packages or chip dies connected to the same Flash memory interface.

A method for operating a Flash memory controller according to an embodiment of the present invention comprises steps in which the Flash memory controller receives a first instruction relating to a first Flash memory package coupled to the Flash memory controller through a first Flash memory interface, in which the Flash memory controller receives a second instruction relating to a second Flash memory package coupled to the Flash memory controller through the first Flash memory interface, in which the Flash memory controller splits a first process depending on the first instruction into at least two first sub-steps, in which the Flash memory controller splits a second process depending on the second instruction into at least two second sub-steps, and in which the Flash memory controller executes the first and second sub-steps, wherein the Flash memory controller interleaves execution of first and second sub-steps. This method may improve IO throughput on the Flash memory interface and may eliminate a skew between the times required for executing read and write instructions.

The method may include a step in which, after receiving the first instruction, the Flash memory controller pushes the first instruction onto a queue. The method then also comprises further steps, which are only executed if the first Flash memory interface is marked as free and no unfinished earlier process relating to the first Flash memory package exists, in which the Flash memory controller pulls an earlier instruction relating to the first Flash memory package from the queue, in which the Flash memory controller marks the first Flash memory interface as busy if a first sub-step of a third process depending on the earlier instruction requires using the first Flash memory interface, and in which the Flash memory controller starts executing the first sub-step of the third process. This method may ensure that completing processes that require usage of the same Flash memory interface are executed one after another.

The method may also comprise steps in which the Flash memory controller receives a completion event for a previous sub-step of the third process, the Flash memory controller releases the first Flash memory interface if the first Flash memory interface has been used for executing the previous sub-step. The method then also comprises further steps, which are only executed if the previous sub-step is not the last sub-step of the third process, in which the Flash memory controller marks the first Flash memory interface as busy if the first Flash memory interface is needed for the next sub-step of the third process, and in which the Flash memory controller starts executing the next sub-step of the third process.

This may allow for pipelining sub-steps of several completing processes, thereby reducing the overall execution time of all processes.

The method may also includes steps in which after finishing execution of the third process the Flash memory controller pulls a fourth instruction relating to the first Flash memory package from the queue, the Flash memory controller marks the first Flash memory interface as busy if a first sub-step of a fourth process depending on the fourth instruction requires using the first Flash memory interface, and the Flash memory controller starts executing the first sub-step of the fourth process. This may ensure that processes that have been queued for later execution are executed once the Flash memory interface becomes available again.

DETAILED DESCRIPTION

Brief Description of the Drawings

FIG. 1 shows a simplified schematic representation of a Flash memory system 400. The Flash memory system 400 may for example be a Flash storage device and may for example serve as a replacement for a hard disc drive. The Flash memory system 400 may also be a portable storage device. The Flash memory system 400 comprises a Flash memory controller 500. The Flash memory controller 500 comprises a host interface 570 through which the Flash memory controller 500 may communicate with an external system, for example with a personal computer. The Flash memory controller 500 may receive instructions via the host interface 570, may receive data to store in the Flash memory system 400 via the host interface 570 and may send out data retrieved from the Flash memory system 400 to the host system via the host interface 570.

Figure 1:
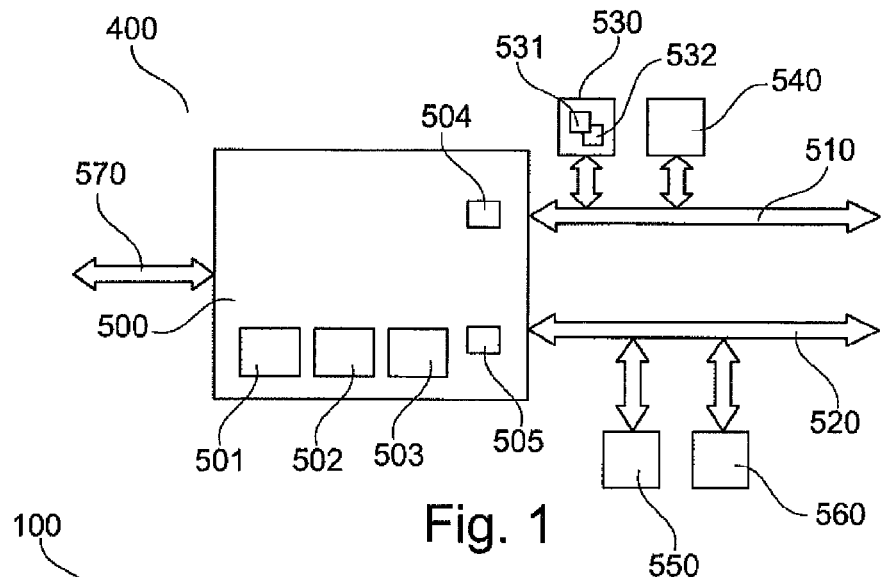
FIG. 1 depicts a schematic representation of a Flash memory system with a Flash memory controller.

The Flash memory controller 500 is coupled to a first Flash memory interface 510 and to a second Flash memory interface 520. In alternative embodiments the Flash memory controller 500 may be coupled only to the first Flash memory interface 510 or may be coupled to more than two Flash memory interfaces 510, 520. The Flash memory interface 510, 520 may also be referred to as channels. A first Flash memory package 530 and a second Flash memory package 540 are coupled to the first Flash memory interface 510. In alternative embodiments only the Flash memory package 530 may be provided or the first Flash memory interface 510 may be coupled to more than two Flash memory packages 530, 540. A third Flash memory package 550 and a fourth Flash memory package 560 are coupled to the second Flash memory interface 520. In alternative embodiments also the second Flash memory interface may be coupled to only one Flash memory package 550 or to more than two Flash memory packages 550, 560. At each point in time, each Flash memory interface 510, 520 may currently be in use, which throughout this description will also be referred to as busy or occupied, or it may currently be not in use, which will be referred to as free or available.

Each Flash memory package 530, 540, 550, 560 comprises one or more chip dies. In the example embodiment depicted in FIG. 1 the first Flash memory package 530 comprises a first chip die 531 and second chip die 532. Each chip die 531, 532 may for example comprise 2 GB of memory cells. The memory cells of each die may for example be grouped into 8192 blocks. Each block of each chip die 531, 532 may in turn be grouped into 64 pages, each page comprising 4 KB of memory cells. The memory cells of each page may store data, metadata or error detection or correction information.

The Flash memory controller 500 further comprises an instruction queue 501, a process list 502, a timer device 503, a first flag 504 and a second flag 505. The instruction queue 501, the process list 502 and the flags 504, 505 may for example be designed as RAM memory cells. Preferably, the instruction queue 501 is adapted as a FIFO (first in, first out) queue. The instruction queue 501 may, however, also be adapted in another way. The timer device 503 is capable of triggering events at programmable points in time. An event triggered by the timer device 503 triggers execution of a predefined routine by the Flash memory controller 500.

The Flash memory controller 500 may comprise further components necessary for operating the Flash memory packages 530, 540, 550, 560. The Flash memory controller 500 may for example maintain a list that maps logical block addresses of the Flash memory packages 530, 540, 550, 560 to physical block addresses of the Flash memory packages 530, 540, 550, 560. The Flash memory controller 500 may also comprise a wear-leveling garbage collection and a bad block management. These components are well known to those of skill in the art in the field of Flash memory systems.

The Flash memory controller 500 is designed for receiving instructions through the host interface 570. Instructions may be either read instructions, write instructions or erase instructions. A read instruction instructs the Flash memory controller 500 to execute a process that reads out data stored in one of the Flash memory packages 530, 540, 550, 560 and to send the retrieved data via the host interface 570. A write instruction instructs the Flash memory controller 500 to retrieve data via the host interface 570 and to store the retrieved data in one of the Flash memory packages 530, 540, 550, 560. An erase instruction instructs the Flash memory controller 500 to execute a process that erases the data stored in one or more blocks of one of the Flash memory packages 530, 540, 550, 560.

Figure 2:
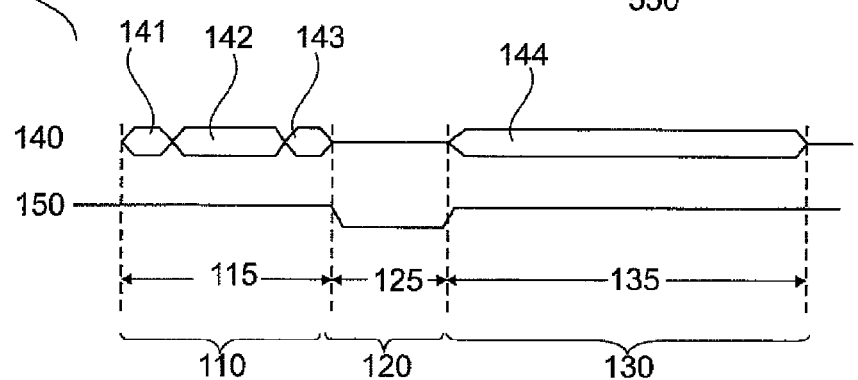
FIG. 2 shows a timing diagram of a read process.

FIG. 2 shows a schematic diagram of a read process 100 executed by the Flash memory controller 500 upon receiving a read instruction. The read process comprises a first read sub-step 110, a second read sub-step 120 and a third read sub-step 130. The example diagram of FIG. 2 assumes that the read process 100 reads data stored in one of the chip dies 531, 532 of the first Flash memory package 530 coupled to the first Flash memory interface 510. The horizontal axis of FIG. 2 depicts increasing time. A first graph 140 depicts data traffic on the first Flash memory interface 510. A second graph 150 depicts whether the Flash memory interface 510 is busy or free. An upper level of the graph 150 indicates that the first Flash memory interface 510 is required during execution of the read process 100 and is thus busy, while a lower level of the graph 150 indicates that the first Flash memory interface 510 is not used during this period of execution of the read process 100 and is thus free.

During the first read sub-step 110 the Flash memory controller 500 consecutively sends a first command code 141, a page address 142 and a second command code 143 to the first Flash memory package 530 via the first Flash memory interface 510. The first read sub-step 110 lasts for a first read sub-step duration 115 that is seven clock cycles long. One clock cycle may for example require 25 ns. During the first read sub-step 110 the first Flash memory interface 510 is required for transferring the first command code 141, the page address 142 and the second command code 143, and therefore not available for other processes.

During the second read sub-step 120 the first Flash memory package 530 retrieves the requested data from one of the chip dies 531, 532 and stores the data in an internal buffer associated with the respective chip die of the first Flash memory package 530. The second read sub-step 120 lasts for a second read sub-step duration 125 that may for example be 25 µs long. The first Flash memory interface 510 is not required for the read process 100 during the second read sub-step 120, as is indicated by the second graph 150.

During the third read sub-step 130 the flash memory controller 500 retrieves the requested data 144 from the internal buffer associated with the respective chip die of the first Flash memory package 530 via the first Flash memory interface 510. The third read sub-step 130 lasts for a third read sub-step duration 135 that may for example be 100 µs long. During the third read sub-step 130 the first Flash memory interface 510 is occupied by the read process 100, as is indicated by the graph 150 in FIG. 2.

Figure 3:
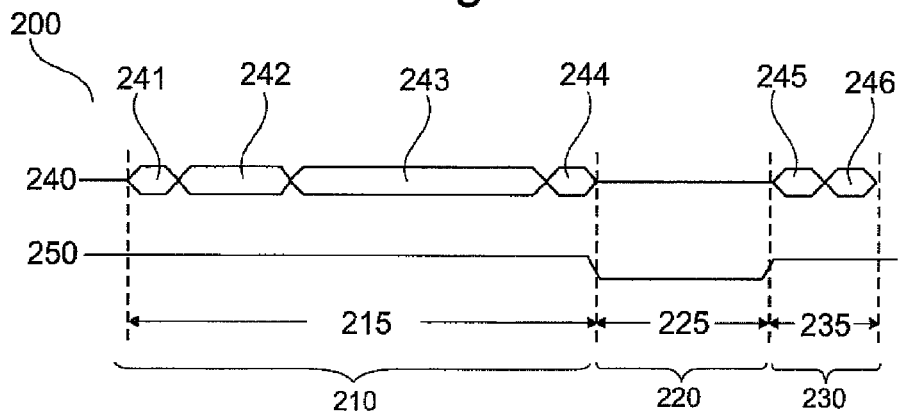
FIG. 3 shows a timing diagram of a write process.

FIG. 3 displays a schematic timing diagram of a write process 200 executed by the Flash memory controller 500. In the example of FIG. 3 it is assumed that the write process 200 writes data to one of the chip dies 531, 532 of the first Flash memory package 530. The horizontal axis of FIG. 3 depicts increasing time. A first graph 240 depicts data transferred between the Flash memory controller 500 and the first Flash memory package 530 via the first Flash memory interface 510. A second graph 250 depicts whether the first Flash memory interface 510 is required at a respective point in time during execution of the write process 200. An upper level indicates that the first Flash memory interface 510 is required, while a lower level indicates that the first Flash memory interface 510 is not required. The write process 200 comprises a first write sub-step 210, a second write sub-step 220 and a third write sub-step 230.

During the first write sub-step 210 the Flash memory controller 500 consecutively sends a first command code 241, a page address 242, data 243 to be stored in the memory cells of one of the chip dies 531, 532 of the first Flash memory package 530 and a second command code 244 to the first Flash memory package 530 via the first Flash memory interface 510. Hence, the first Flash memory interface 510 is occupied during the first write sub-step 210. The first write sub-step 210 lasts for a first write sub-step duration 215 that may be approximately 100 µs long. The first Flash memory package 530 first stores the retrieved data 243 in the internal buffer that is associated with the respective chip die 531, 532 of the first Flash memory package 530.

During the second write sub-step 220 the first Flash memory package 530 writes the data 243 stored in the internal buffer of the first Flash memory package 530 to the individual memory cells of the chip dies 531, 532. During the second write sub-step 220 the first Flash memory interface 510 is not required for the write process 200. The second write sub-step 200 lasts for a second write sub-step duration 225 that may for example be 200 µs long.

During the third write sub-step 230 the Flash memory controller 500 retrieves a third command code 245 and a fourth command code 246 from the first Flash memory package 530 via the Flash memory interface 510 to determine if the data write has been executed successfully. Hence, the first Flash memory interface 510 is busy during the third write sub-step 230. The third write sub-step 230 lasts for a third write sub-step duration 235 that may for example be two clock cycles long.

Figure 4:
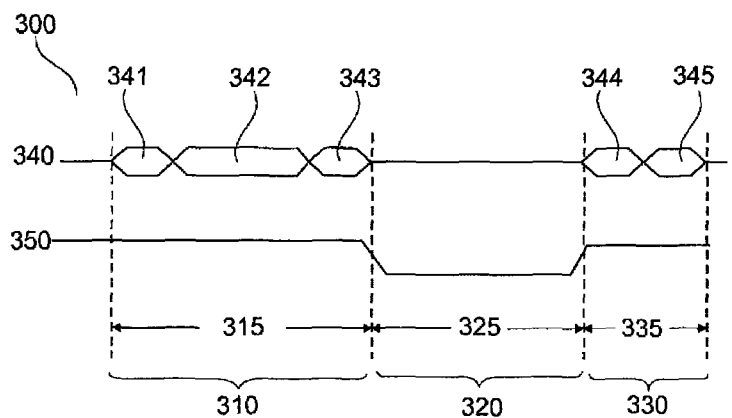
FIG. 4 shows a timing diagram of an erase process.

FIG. 4 depicts a schematic timing diagram of an erase process 300 executed by the Flash memory controller 500. In the example of FIG. 4 it is assumed that the erase process 300 erases data from memory cells of one of the chip dies 531, 532 of the first Flash memory package 530. The horizontal axis again depicts increasing time. A first graph 340 depicts data transferred between the Flash memory controller 500 and the first Flash memory package 530 via the first Flash memory interface 510. A second graph 350 depicts if the first Flash memory interface 510 is required for executing the erase process 300 at a respective point in time. The erase process 300 comprises a first erase sub-step 310, a second erase sub-step 320 and a third erase sub-step 330.

During the first erase sub-step 310 the Flash memory controller 500 sends a first command code 341, a block address 342 and a second command code 343 to the first Flash memory package 530 via the first Flash memory interface 510. Hence, the first Flash memory interface 510 is busy during the first erase sub-step 310. The first erase sub-step 310 lasts for a first erase sub-step duration 315 that may for example be seven clock cycles long.

During the second erase sub-step 320 the first Flash memory package 530 erases the data from the memory cells of the block with block address 342. The second erase sub-step 320 lasts for a second erase sub-step duration 325 that may for example be 1.5 ms long. During the second erase sub-step 320 the first Flash memory interface 510 is not occupied for the erase process 300.

During the third erase sub-step 330 the Flash memory controller 500 retrieves a third command code 344 and a fourth command code 345 from the first Flash memory package 530 via the first Flash memory interface 510 to determine if erasing the data from the requested block has been successful. Hence, the first Flash memory interface 510 is occupied by the erase process 300 during the third erase sub-step 330. The third erase sub-step 330 lasts for a third erase sub-step duration 335 that may for example be two clock cycles long.

The timing diagrams of FIGS. 2 and 3 show that the read process 100 altogether takes about 125 µs, while the write process 200 altogether takes about 300 ms. Thus the read process 100 is faster than the write process 200.

FIG. 1 shows that the first Flash memory package 530 and the second Flash memory package 540 are both coupled to the Flash memory controller 500 through the first Flash memory interface 510. In a conventional Flash memory system the first Flash memory interface 510 is completely blocked while the Flash memory controller 500 executes a process related to the first chip die 531 of the first Flash memory package 530. Consequently, the Flash memory controller 500 cannot execute a process related to the second chip die 532 of the first Flash memory package 530 before the competing process related to the first chip die 531 of the first Flash memory package 530 has finished. This applies accordingly to any further Flash memory packages coupled to the first Flash memory interface 510.

The examples of FIGS. 2, 3 and 4, however, have shown that the read process 100, the write process 200 and the erase process 300 each comprise sub-steps during which the first Flash memory interface 510 is not required. One idea of the present invention is to make use of these intervals for executing sub-steps of competing processes in parallel. This allows for achieving an improved overall performance. This method especially allows for making the read process 100 and the write process 200 equally fast.

The proposed method for example allows to partially execute the first read process related to the first chip die 531 of the first Flash memory package 530 in parallel to a second read process related to the second chip die 532 of the first Flash memory package 530. Two processes related to the same chip die of the Flash memory package must, however, still execute sequentially to avoid a corruption of data. The principle is to pipeline sub-steps of processes related to Flash memory packages coupled to the same Flash memory interface while letting read processes, write processes and erase processes complete according to their sub-steps in sequence without corruption.

To accomplish this, the Flash memory controller 500 keeps track of all incomplete read processes, write processes and erase processes for each Flash memory interface coupled to the Flash memory controller 500, as well as it keeps track of the current sub-step of each incomplete read process, write process and erase process. This information is stored in the process list 502 of the Flash memory controller 500. The Flash memory controller 500 further maintains a timer for each incomplete read process, write process and erase process, to know once a sub-step of one of these processes completes. To do so, the Flash memory controller 500 makes use of the timer device 503. Any time one of the Flash memory interfaces 510, 520 is free, the Flash memory controller 500 checks if it is possible to advance an incomplete process to its respective next sub-step, and if not, checks if it is possible to start a new read process, write process or erase process. The Flash memory controller 500 maintains the flags 504, 505 to determine if the Flash memory interfaces 510, 520 is busy or free.

Figure 5:
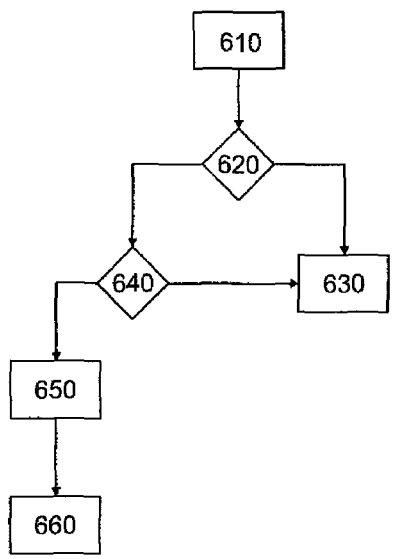
FIG. 5 shows a schematic flow diagram of a method for operating a Flash memory controller.

FIG. 5 shows a schematic flow diagram depicting steps of a method executed by the Flash memory controller 500. In a first step 610 the Flash memory controller 500 receives an instruction related to one of the chip dies of the one of the Flash memory packages 530, 540, 550, 560 via the host interface 570. The instruction received by the Flash memory controller 500 in the first step 610 may for example be a read instruction related to the first chip die 531 of the first Flash memory package 530. In a second step 620 the Flash memory controller 500 checks the flags 504, 505 to determine whether the required Flash memory interface 510, 520 is busy or occupied. In the present example the Flash memory controller 500 for example checks the first flag 504 to determine if the first Flash memory interface 510 is free. If the relevant Flash memory interface 510, 520 is currently occupied the Flash memory controller 500 pushes the retrieved instruction onto the instruction queue 501 in a third step 630 and finishes execution of the method. If the relevant Flash memory interface 510, 520, however, is free, the Flash memory controller 500 checks in a fourth step 640, if an earlier process related to the same chip die 531, 532 of the same Flash memory package 530, 540, 550, 560 has not finished yet. In the given example, the Flash memory controller 500 checks if an earlier process related to the first chip die 531 of the Flash memory package 530 is unfinished. The Flash memory controller 500 performs this check by looking up the process list 502. If the check shows that an unfinished process exists, the Flash memory controller 500 pushes the instruction received in the first step 610 onto the instruction queue 501 and finishes execution. Otherwise the method continues with a fifth step 650 in which the current instruction is pushed onto the instruction queue 501. Afterwards, the Flash memory controller 500 pulls one instruction from the instruction queue 501 in a sixth step 660 and starts executing this instruction. Pushing the instruction received in the first step 610 onto the instruction queue 501 in the fifth step 650 and pulling one instruction from the instruction queue 501 in the sixth step 660 makes sure that instructions received earlier are executed earlier by the Flash memory controller 500. In order to execute a process related to the instruction pulled from the instruction queue 501 in the sixth step 660 the Flash memory controller 500 marks the first Flash memory interface 510 as busy using the first flag 504, sets up the timer device 503 to trigger an event upon completion of the first sub-step of the process and then starts execution of the first sub-step of the process.

Figure 6:
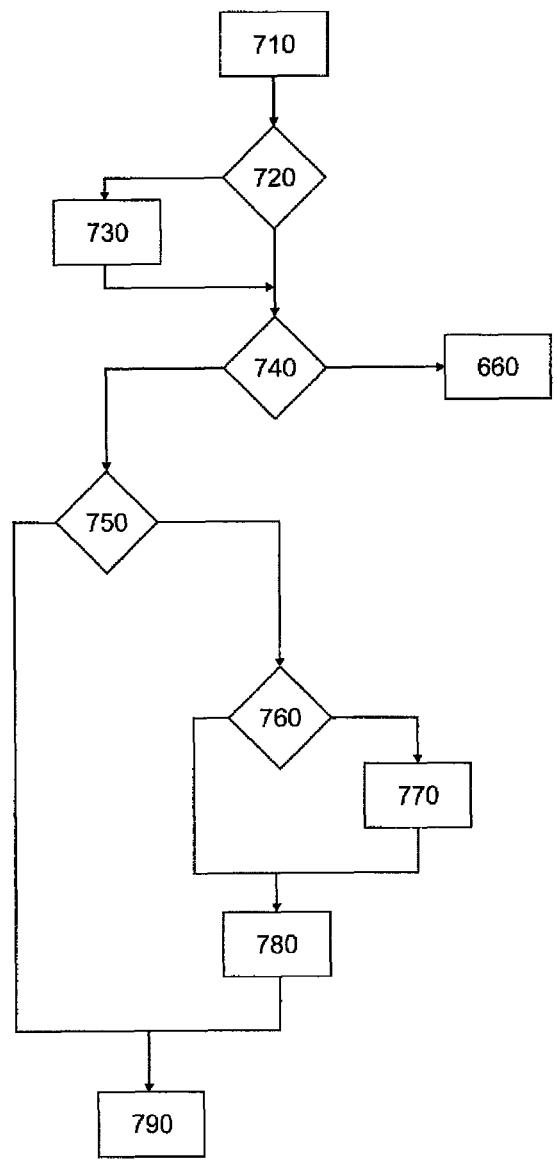
FIG. 6 shows a schematic flow diagram of further steps of a method for operating a Flash memory controller.

The Flash memory controller 500 is further adapted to execute a method depicted in the schematic flow diagram of FIG. 6. In this method the Flash memory controller 500 receives a sub-step completion event from the timer device 503 in a first step 710. The completion event triggered by the timer device 503 indicates that a sub-step of a process started earlier has completed. In a second step 720 the Flash memory controller 500 checks if the completed sub-step required using one of the Flash memory interfaces 510, 520. If this was not the case the Flash memory controller 500 directly advances to a fourth step 740. If the completed sub-step, however, did use one of the Flash memory interfaces 510, 520, the Flash memory controller 500 marks the respective Flash memory interface 510, 520 as free in a third step 730 by modifying the respective flag 504, 505. If the completed sub-step for example was using the first Flash memory interface 510 the Flash memory controller 500 marks the first flag 504 as free. The Flash memory controller 500 then advances to the fourth step 740 in which the Flash memory controller 500 checks if the completed sub-step was the last sub-step of the respective process. If this is the case the Flash memory controller 500 completes execution of the respective process and then jumps to the sixth step 660 of the method depicted in FIG. 5 to pull a next instruction from the instruction queue 501 and starts executing that instruction. If the check in the fourth step 740, however, shows that the completed step was not the last step of the respective process, the Flash memory controller 500 advances to a fifth step 750 in which the Flash memory controller 500 checks if the next sub-step of the respective process will require using one of the Flash memory interfaces 510, 520. If this is not the case the Flash memory controller 500 advances to a ninth sub-step 790. If the next sub-step, however, requires using one of the Flash memory interfaces 510, 520 the Flash memory controller advances to a sixth step 760 in which the Flash memory controller 500 checks if the respective Flash memory interface 510, 520 is currently free. The Flash memory controller 500 does so by checking the flags 504, 505. If the next sub-step of the current process for example requires using the first Flash memory interface 510 the Flash memory controller 500 checks the first flag 504. If the required Flash memory interface 510, 520 is available the Flash memory controller 500 advances to an eighth step 780. Otherwise the Flash memory controller 500 waits until the respective Flash memory interface 510, 520 becomes free in a seventh step 770. Once the required Flash memory interface 510, 520 becomes free the Flash memory controller 500 continues with the eighth step 780. In the eighth step 780 the Flash memory controller 500 marks the respective Flash memory interface 510, 520 as busy by modifying one of the flags 504, 505. Then the Flash memory controller 500 continues with the ninth step 790 in which the Flash memory controller 500 sets up the timer device 503 to trigger an event upon completion of the next sub-step of the current process and then starts executing the next sub-step of the current process.

The invention claimed is:

1. A Flash memory controller adapted to couple to a first Flash memory package and a second Flash memory package through a first Flash memory interface, the Flash memory controller to receive a first instruction relating to the first Flash memory package and adapted to perform a first process depending on the first instruction, the Flash memory controller to receive a second instruction relating to the second Flash memory package and adapted to perform a second process depending on the second instruction, wherein the Flash memory controller is adapted to split the first process into multiple first sub-steps and adapted to split the second process into multiple second sub-steps, wherein the Flash memory controller is further adapted to interleave execution of the first and second sub-steps during time intervals within a first or second sub-steps in which said first flash memory interface is not-busy;
   Wherein the flash memory controller is connected to multiple flash memory interfaces, each of which is connected to multiple flash memory packages or chip dies;
   wherein the Flash memory controller retrieves and stores data from the Flash memory packages by issuing a stream of processes comprising one or more of: a read, write and erase process,
   wherein every read, write or erase process is split into multiple sub-steps, the Flash memory controller configured to perform sub-steps in a later process before sub-steps of an earlier process have completed, wherein multiple processes can proceed in parallel inside multiple Flash memory packages or chip dies connected to the first Flash memory interface.

2. The Flash memory controller as claimed in claim 1, wherein the Flash memory controller comprises a process list, wherein the Flash memory controller is adapted to store an unfinished process and a current sub-step of the unfinished process in the process list.

3. The Flash memory controller as claimed in claim 1, wherein the Flash memory controller maintains a timer for an unfinished process wherein the timer is adapted to trigger an event upon completion of a sub-step of the unfinished process.

4. The Flash memory controller as claimed in claim 1, wherein the Flash memory controller comprises an instruction queue, wherein the Flash memory controller is adapted to push the first and/or the second instruction onto the instruction queue.

5. The Flash memory controller as claimed in claim 1, wherein the first instruction is a read instruction, wherein the first process is a read process, wherein the read process is split into three sub-steps.

6. The Flash memory controller as claimed in claim 1, wherein the first instruction is a write instruction, wherein the first process is a write process, wherein the write process is split into three sub-steps.

7. The Flash memory controller as claimed in claim 1, wherein the first instruction is an erase instruction, wherein the first process is an erase process, wherein the erase process is split into three sub-steps.

8. The Flash memory controller as claimed in claim 1, wherein the first Flash memory package comprises a first chip die, wherein the first instruction relates to the first chip die of the first Flash memory package, wherein the Flash memory controller is designed to receive a third instruction relating to the first chip die of the first Flash memory package and to perform a third process depending on the third instruction, wherein the Flash memory controller is designed for splitting the third process into at least two third sub-steps, wherein the Flash memory controller is adapted to finish execution of all first sub-steps before starting execution of a third sub-step.

9. The Flash memory controller as claimed in claim 1, wherein the Flash memory controller is coupled to a third Flash memory package through a second Flash memory interface.

10. The Flash memory controller as claimed in claim 1, wherein the Flash memory controller comprises a host interface, wherein the Flash memory controller is adapted for receiving the first instruction and the second instruction through the host interface.

11. The Flash memory controller as claimed in claim 1, wherein the Flash memory controller comprises a flag that marks the first Flash memory interface as busy or as free.

12. A method for operating a Flash memory controller comprising the steps of:
- receiving a first instruction relating to a first Flash memory package coupled to the Flash memory controller through a first Flash memory interface;
- receiving a second instruction relating to a second Flash memory package coupled to the Flash memory controller through the first Flash memory interface;
- splitting a first process depending on the first instruction into multiple first sub-steps;
- splitting a second process depending on the second instruction into multiple second sub-steps;
- executing the first and second sub-steps, wherein the Flash memory controller interleaves execution of first and second sub-steps during time intervals within first or second sub-steps in which said first flash memory interface is not-busy;
- Wherein the flash memory controller is connected to multiple flash memory interfaces, each of which is connected to multiple flash memory packages or chip dies;
- Wherein the Flash memory controller retrieving and storing data from the Flash memory packages by issuing a stream of processes comprising one or more of: a read, write and erase process,
- wherein every read, write or erase process is split into multiple sub-steps, the Flash memory controller is adapted to perform sub-steps in a later process before sub-steps of an earlier process have completed, wherein multiple processes can proceed in parallel inside multiple Flash memory packages or chip dies connected to the first Flash memory interface.

13. The method as claimed in claim 12, wherein after receiving the first instruction, the Flash memory controller pushing the first instruction onto a queue; wherein if the first Flash memory interface is marked as free and no unfinished earlier process relating to the first Flash memory package exists, then the Flash memory controller performs: pulling an earlier instruction relating to the first Flash memory package from the queue;
- marking the first Flash memory interface as busy if a first sub-step of a third process depending on the earlier instruction requires using the first Flash memory interface; and start executing the first sub-step of the third process.

14. The method as claimed in claim 13, further comprising:
- receiving, at said Flash memory controller, a completion event for a previous sub-step of the third process;
- releasing, by said Flash memory controller, the first Flash memory interface if the first Flash memory interface has been used for executing the previous sub-step; wherein the following steps are only executed if the previous sub-step is not the last sub-step of the third process:
- marking the first Flash memory interface as busy if the first Flash memory interface is needed for the next sub-step of the third process;
- and start executing the next sub-step of the third process.

15. The method as claimed in claim 14, wherein after finishing execution of the third process, said method comprising:
- pulling, by said Flash memory controller, a fourth instruction relating to the first Flash memory package from the queue;
- marking the first Flash memory interface as busy if a first sub-step of a fourth process depending on the fourth instruction requires using the first Flash memory interface; and
- start executing the first sub-step of the fourth process.

* * * * *